US009697757B2

(12) United States Patent
Ai

(10) Patent No.: US 9,697,757 B2
(45) Date of Patent: Jul. 4, 2017

(54) METHOD AND SYSTEM OF DETERMINING A LOCATION OF A LINE FAULT OF A PANEL

(71) Applicants: BOE TECHNOLOGY GROUP CO., LTD., Beijing (CN); Hefei Xinsheng Optoelectronics Technology Co., Ltd., Anhui (CN)

(72) Inventor: Yu Ai, Beijing (CN)

(73) Assignees: Boe Technoogy Group Co., Ltd., Beijing (CN); Hefei Xinsheng Optoelectronics Technology Co., Ltd., Anhui (CN)

( * ) Notice: Subject to any disclaimer, the term of this patent is extended or adjusted under 35 U.S.C. 154(b) by 19 days.

(21) Appl. No.: 14/800,806

(22) Filed: Jul. 16, 2015

(65) Prior Publication Data

US 2016/0231374 A1 Aug. 11, 2016

(30) Foreign Application Priority Data

Feb. 9, 2015 (CN) .......................... 2015 1 0067555

(51) Int. Cl.
*G01R 31/08* (2006.01)
*G09G 3/00* (2006.01)
*G09G 3/36* (2006.01)

(52) U.S. Cl.
CPC ........... *G09G 3/006* (2013.01); *G09G 3/3648* (2013.01)

(58) Field of Classification Search
CPC ................................ G01R 31/08; G09G 3/006
(Continued)

(56) References Cited

U.S. PATENT DOCUMENTS 4,278,931 A * 7/1981 Huggins ................. H04M 3/28 324/523
5,087,874 A * 2/1992 Robinson ............. G01R 31/281 324/523
(Continued)

FOREIGN PATENT DOCUMENTS

CN 101644735 2/2010
CN 102681222 9/2012
CN 102955097 3/2013

OTHER PUBLICATIONS

Office Action from China Application No. 2015100675552 dated Jan. 3, 2017.

*Primary Examiner* — Patrick Assouad
*Assistant Examiner* — Demetrius Pretlow
(74) *Attorney, Agent, or Firm* — Calfee, Halter & Griswold LLP

(57) ABSTRACT

The present disclosure discloses a method and system of determining a location of a line fault of a panel. The method comprises: connecting a front end point of a metal wire that is determined to have suffered the line fault to a probe of a test instrument, the other probe of the test instrument being connected to a common electrode wire; performing a fusing-off processing on the metal wire according to a preset rule; and determining the location of the line fault of the metal wire based on a variation in the readings from the test instrument upon the fusing-off of the metal wire. The system comprises: a test instrument, one probe of which being connected to a front end point of a metal wire that is determined to have suffered the line fault, the other probe of which being connected to a common electrode wire; and a laser for performing a fusing-off processing on the metal wire. The short circuit of the metal wire may be localized at a pixel cell level using the method and system according to the embodiments of the present disclosure.

13 Claims, 12 Drawing Sheets

(58) Field of Classification Search
USPC ....... 324/512, 519–527, 531, 760.01–760.02
See application file for complete search history.

(56) References Cited

U.S. PATENT DOCUMENTS

| | | | | | |
|---|---|---|---|---|---|
| 5,175,504 | A * | 12/1992 | Henley | G09G 3/006 219/121.68 |
| 5,639,390 | A * | 6/1997 | Iino | B23K 31/12 219/121.65 |
| 5,701,081 | A * | 12/1997 | Rapaport | H04N 17/04 324/511 |
| 6,759,860 | B1 * | 7/2004 | Hsiung | G01R 31/2887 324/750.19 |
| 2004/0239364 | A1 | 12/2004 | Chung | |
| 2010/0201395 | A1 * | 8/2010 | Ukai | G01R 31/2884 324/760.01 |
| 2013/0307557 | A1 * | 11/2013 | Lee | G09G 3/006 324/522 |
| 2014/0375347 | A1 * | 12/2014 | Wang | G09G 3/006 324/760.02 |

* cited by examiner

METHOD AND SYSTEM OF DETERMINING A LOCATION OF A LINE FAULT OF A PANEL

RELATED APPLICATIONS

The present application claims the benefit of Chinese Patent Application No. 201510067555.2, filed Feb. 9, 2015, the entire disclosure of which is incorporated herein by reference.

FIELD OF THE DISCLOSURE

The present disclosure relates to the field of display technologies, and particularly to a method and system of determining a location of a line fault of a panel.

BACKGROUND OF THE DISCLOSURE

In the existing manufacturing process of the thin film transistor liquid crystal display (TFT-LCD), failures such as a line fault and the like often occur due to e.g. a mechanical breakdown or an artificial mistake. The line fault generally results from an open circuit outside the pixel region (i.e. the non-display region) or a short circuit inside the pixel region (i.e. the display region). The open circuit outside the pixel region may be pinpointed by a line patrol via a microscope. The short circuits inside the pixel region may be categorized into ones caused by particles and ones between films, wherein the location of a particle-caused short circuit can be observed by a line patrol via human eyes, while the location of a short circuit between films, especially that of a Gate line-Common electrode Short circuit (GCS) or a Data line-Common electrode Short circuit (DCS), cannot be observed either by human eyes or by a microscope. Therefore, the existing schemes for line fault localization are unable to accurately determine the location of a short circuit between films.

SUMMARY OF THE DISCLOSURE

It is an object of the present disclosure to provide a method and system of determining a location of a line fault of a panel for solving the problem with the prior art that the location of a line fault (in particular a short circuit) between films is difficult to determine.

According to a first aspect of the present disclosure, there is provided a method of determining a location of a line fault of a panel, comprising: connecting a front end point of a metal wire that is determined to have suffered the line fault to a probe of a test instrument, the other probe of the test instrument being connected to a common electrode wire; performing a fusing-off processing on the metal wire according to a preset rule; and determining the location of the line fault of the metal wire based on a variation in the readings from the test instrument upon the fusing-off of the metal wire.

Optionally, performing the fusing-off processing on the metal wire according to the preset rule comprises: selecting a midpoint of the metal wire as the point-for-fusing and performing the fusing-off processing on the metal wire at the selected point-for-fusing.

Optionally, in the case that the line fault suffered by the metal wire is a short circuit, determining the location of the line fault of the metal wire based on the variation in the readings from the test instrument upon the fusing-off of the metal wire comprises: upon the fusing-off of the metal wire, if the variation in the readings from the test instrument reaches a preset threshold, determining the location of the short circuit as being at the line section between the point-for-fusing and a back end point of the metal wire; otherwise determining the location of the short circuit as being at the line section between the point-for-fusing and the front end point of the metal wire, wherein the preset threshold is determined based on the resistance of the metal wire.

Optionally, the method further comprises the following iterative process: if the location of the short circuit is determined as being at the line section between the point-for-fusing and the back end point of the metal wire, move to step 1; if the location of the short circuit is determined as being at the line section between the point-for-fusing and the front end point of the metal wire, move to step 2; step 1: defining the line section where the short circuit of the metal wire is determined to be located as the current short circuit line, welding up the point-for-fusing, and moving to step 3; step 2: defining the line section where the short circuit of the metal wire is determined to be located as the current short circuit line, and moving to step 3; step 3: performing the fusing-off processing on the current short circuit line according to the preset rule; step 4: upon the fusing-off of the current short circuit line, if the variation in the readings from the test instrument reaches the preset threshold, move to step 5; otherwise move to step 6; step 5: determining the location of the short circuit of the metal wire as being at the line section in back of the point-for-fusing in the current short circuit line, and judging whether the determination of the location of the short circuit has reached a preset accuracy, and if so, end the iterative process; otherwise return to step 1; step 6: determining the location of the short circuit of the metal wire as being at the line section in front of the point-for-fusing in the current short circuit line, and judging whether the determination of the location of the short circuit has reached a preset accuracy, and if so, end the iterative process; otherwise return to step 2.

Optionally, after the ending of the iterative process, the method further comprises: defining the line section where the short circuit of the metal wire is determined to be located as the current short circuit line; if the current short circuit line is located in front of the point-for-fusing corresponding to the last fusing-off processing, performing the fusing-off processing step by step on the current short circuit line at a step of one pixel cell starting from the point-for-fusing corresponding to the last fusing-off processing, and locating the short circuit of the metal wire as being between the current point-for-fusing and the point-for-fusing corresponding to the last fusing-off processing in the event that the variation in the readings from the test instrument reaches the preset threshold; if the current short circuit line is located in back of the point-for-fusing corresponding to the last fusing-off processing, welding up the point-for-fusing corresponding to the last fusing-off processing and performing the fusing-off processing step by step on the current short circuit line at a step of one pixel cell starting from the point-for-fusing corresponding to the last fusing-off processing, and locating the short circuit of the metal wire as being between the current point-for-fusing and the point-for-fusing corresponding to the last fusing-off processing in the event that the variation in the readings from the test instrument reaches the preset threshold.

Optionally, the metal wire is a gate line or a data line.

Optionally, the test instrument is a multimeter, and the preset threshold is a preset threshold for resistance or a preset threshold for electric current.

Further, the front end point refers to one of the both end points of the metal wire that is connected to the probe of the test instrument, and the back end point refers to one of the both end points of the metal wire that is not connected to the probe of the test instrument.

Optionally, both the fusing-off and welding up of the metal wire are achieved by a laser irradiation.

According to a second aspect of the present disclosure, there is provided a system for determining a location of a line fault of a panel using the method as described in the first aspect above, comprising: a test instrument, one probe of which being connected to a front end point of a metal wire that is determined to have suffered the line fault, the other probe of which being connected to a common electrode wire; and a laser for performing a fusing-off processing on the metal wire.

Optionally, the laser is further used for performing a welding-up processing at the point-for-fusing when the location of the short circuit is determined as being at the line section between the point-for-fusing and the back end point of the metal wire, so as to enable the detection of the line section between the point-for-fusing and the back end point by the test instrument.

The method and system according to the embodiments of the present disclosure may determine an accurate location of a short circuit of a metal wire, e.g. at a certain pixel cell.

BRIEF DESCRIPTION OF DRAWINGS

To illustrate more clearly the technical solutions of the embodiments of the present disclosure, a brief introduction is made below to the accompanying drawings to be used in the description of the embodiments. Apparently, the drawings described below are only some of the embodiments of the present disclosure, and skilled in the art may derive other figures from those ones without making any inventive efforts.

DETAILED DESCRIPTION OF THE DISCLOSURE

To render the object, solution and advantages of the present disclosure more clear, the embodiments of the present disclosure will be described below in detail with reference to the accompanying drawings. Apparently, the embodiments described are only some of the embodiments of the present disclosure, not all of them. All other embodiments derived from the illustrated and described embodiments by the skilled in the art without making any inventive efforts fall in the scope of the present disclosure.

Figure 1:
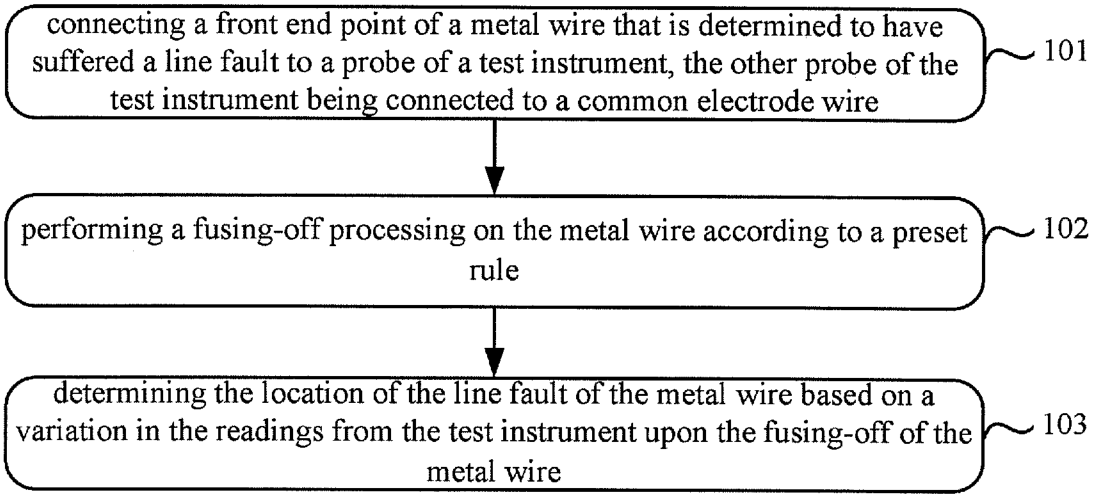
FIG. 1 is a schematic flow chart of a method of determining a location of a line fault of a panel according to an embodiment of the present disclosure.
Figure 2A:
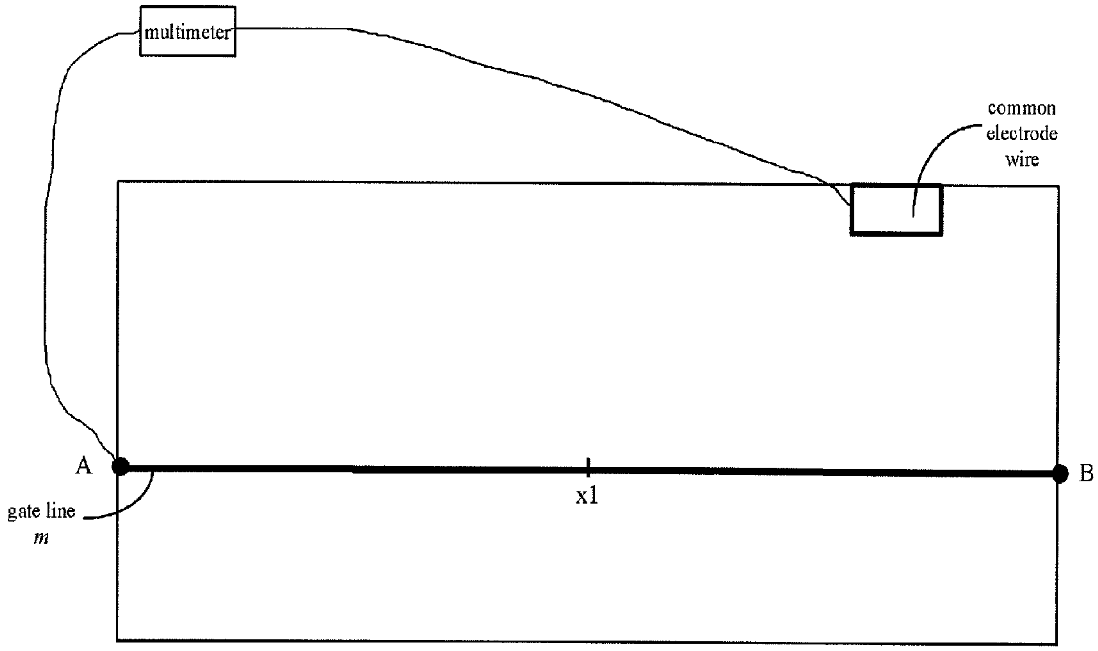
FIGS. 2(*a*) to 2(*j*) are schematic diagrams of the operations for determining a location of a short circuit of a gate line in instance 1 and instance 2 according to embodiments of the present disclosure.
Figure 2B:
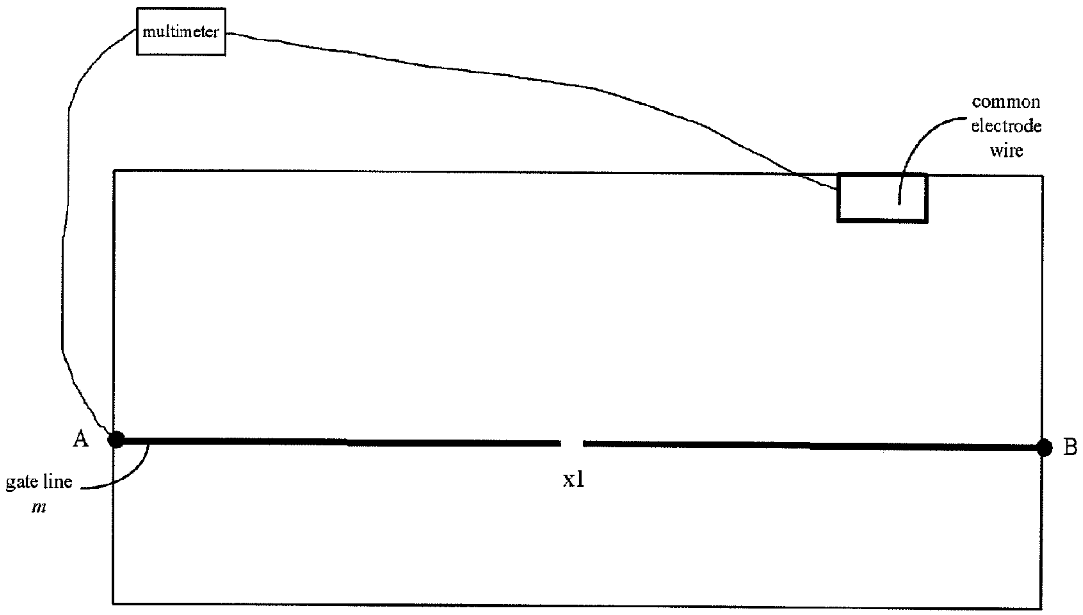
Figure 2C:
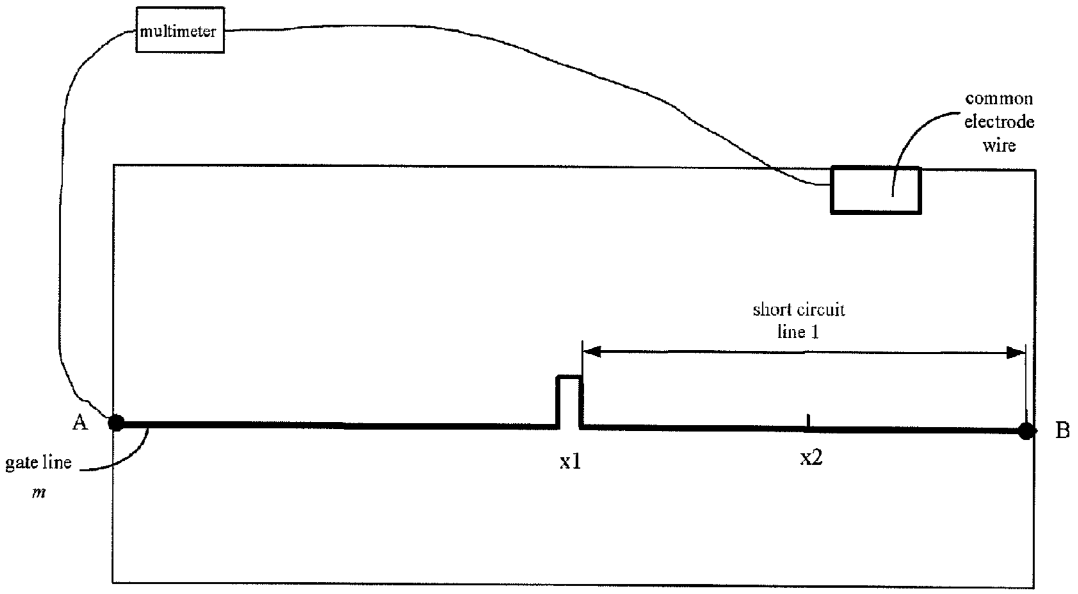
Figure 2D:
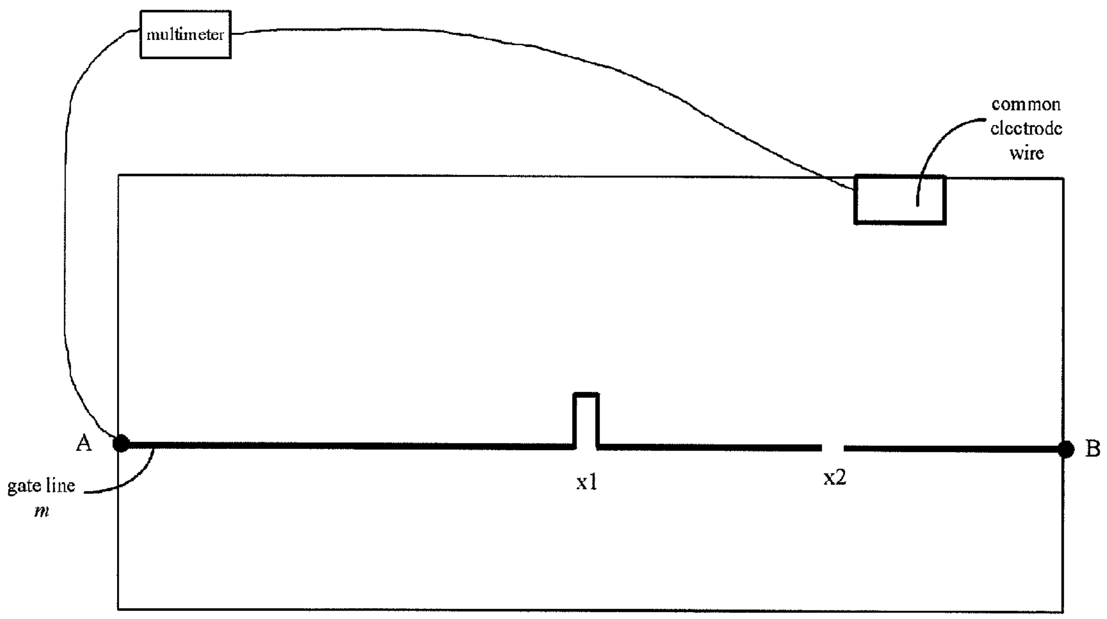
Figure 2E:
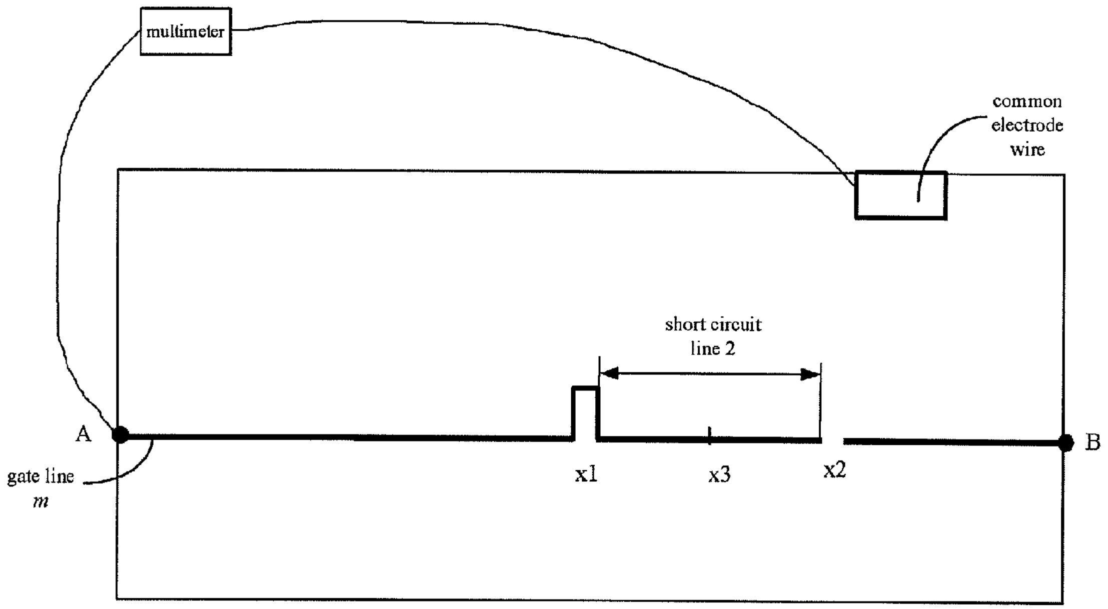
Figure 2F:
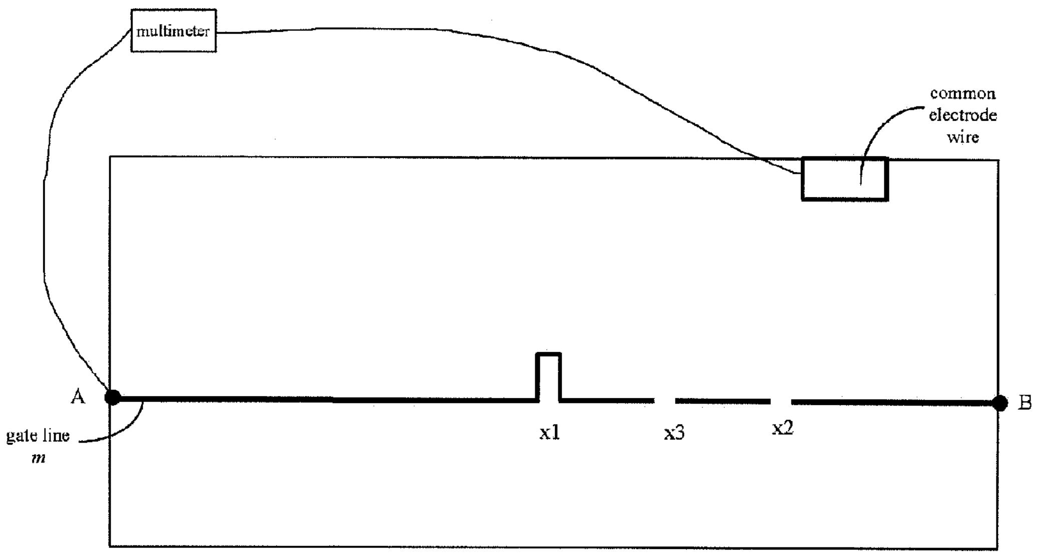
Figure 2G:
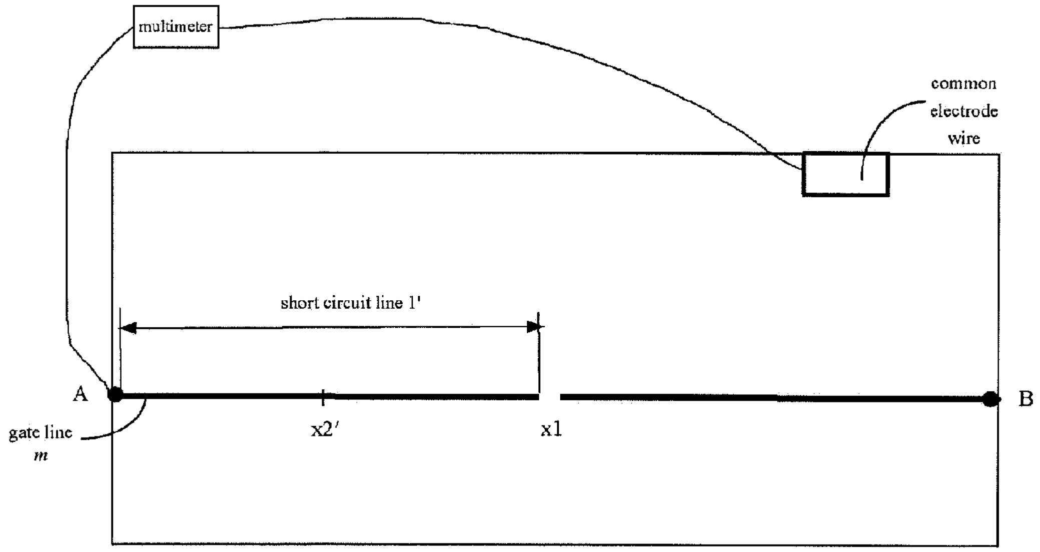
Figure 2H:
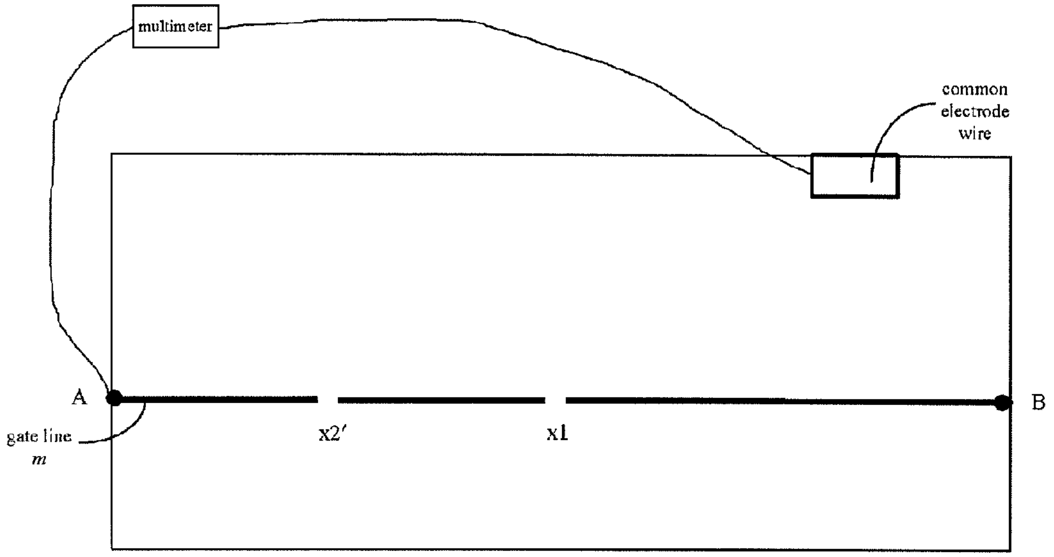
Figure 2I:
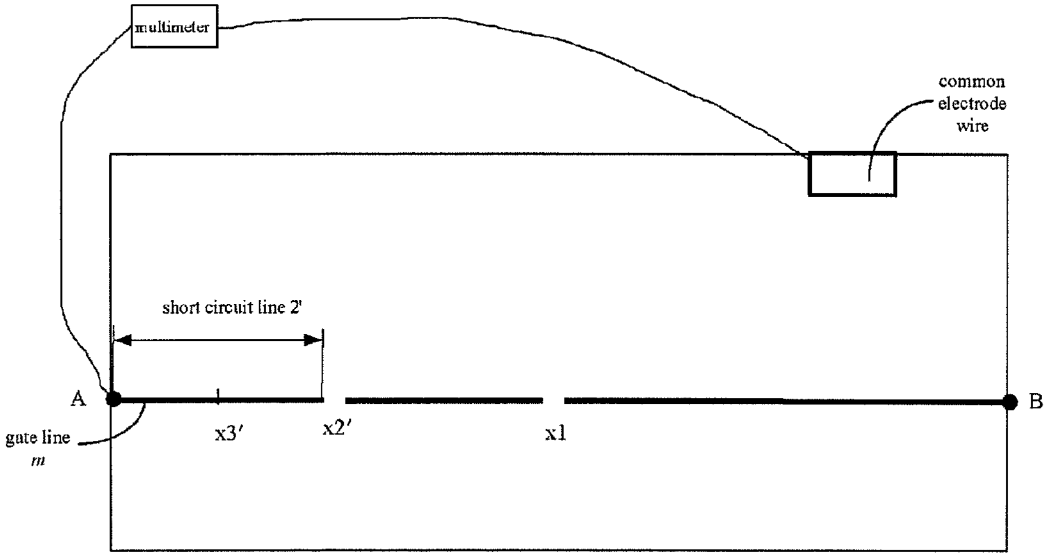
Figure 2J:
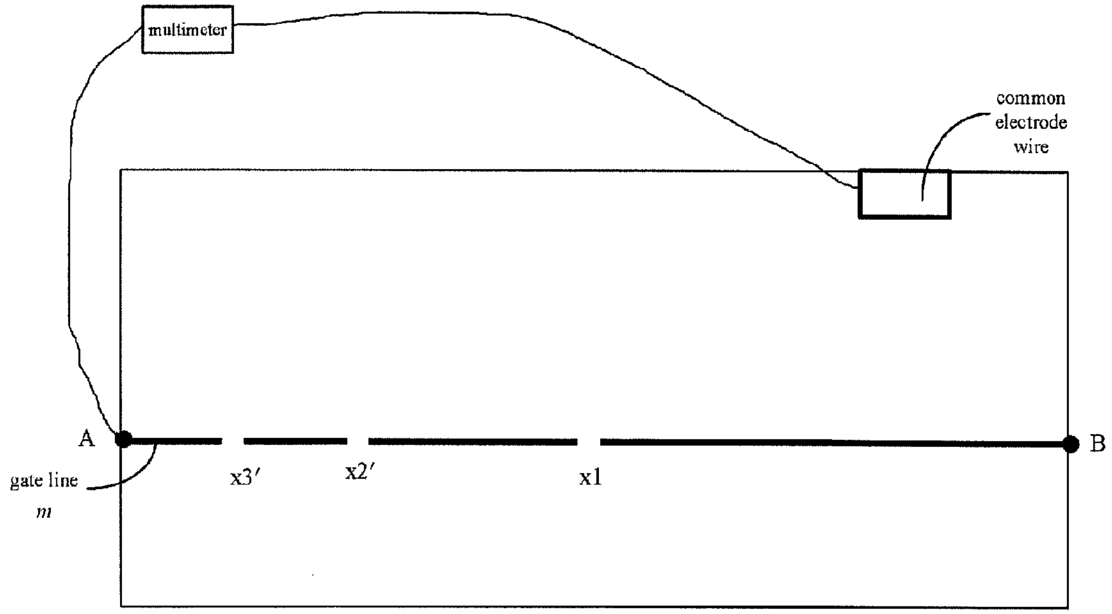

FIG. 1 is a schematic flow chart of a method of determining a location of a line fault of a panel according to an embodiment of the present disclosure. The method may be suitable for detection of a line fault of a display panel, and more specifically, for detection of a Gate line-Common electrode Short circuit (GCS) or a Data line-Common electrode Short circuit (DCS) in a TFT-LCD display panel. The method may comprise the following steps.

Step 101: connecting a front end point of a metal wire that is determined to have suffered the line fault to a probe of a test instrument, and connecting the other probe of the test instrument to a common electrode wire.

In this context, the so-called "front end point" is not to be considered in a spatial sense, but is taken as being "front" to the extent that it is connected to the probe of the test instrument. In other words, one of the both end points of a metal wire that is connected to the probe of the test instrument is referred to as the "front" end point, and the remaining one is referred to as the "back" end point.

Step 102: performing a fusing-off processing on the metal wire according to a preset rule.

Specifically, this step may comprise selecting a midpoint of the metal wire as the point-for-fusing and performing the fusing-off processing on the metal wire at the point-for-fusing.

Step 103: determining the location of the line fault of the metal wire based on a variation in the readings from the test instrument upon the fusing-off of the metal wire.

As stated above, the line fault may be a short circuit, especially a short circuit between a metal wire (e.g., a gate line or a source line) and a common electrode. In this case, step 103 may comprise: upon the fusing-off of the metal wire, if the variation in the readings from the test instrument reaches a preset threshold, determining the location of the short circuit as being at the line section between the point-for-fusing and a back end point of the metal wire; otherwise determining the location of the short circuit as being at the line section between the point-for-fusing and the front end point of the metal wire.

The determination is based on a fact that if the short circuit is present at the line section between the point-for-fusing (i.e., the midpoint of the metal wire) and the back end point, the resistance of the loop formed by the test instrument, the metal wire and the common electrode wire may significantly vary (e.g. by several orders of magnitude) before and after the fusing-off, due to a disconnection of the loop; instead, if the short circuit is present at the line section between the point-for-fusing (i.e., the midpoint of the metal wire) and the front end point, the resistance of the loop formed by the test instrument, the metal wire and the common electrode wire may barely vary before and after the fusing-off, since the point-for-fusing has been bypassed by the loop.

In the above-mentioned embodiment, the metal wire may be a gate line or a source line (also referred to as data line) of a display panel, although this may not be the case. For example, the metal wire can be one of other fault-prone wires. In addition, the test instrument can be a multimeter, and the preset threshold may be a preset threshold for resistance or a preset threshold for electric current. With the multimeter having different measurement functions, a resistance measurement function or electric current measurement function can be selected by configuring a rotary switch on the multimeter. In particular, since the resistance of the metal wire is small and thus a significant variation in the resistance may be observed before and after the fusing-off processing, a resistance measurement function may preferably be selected to detect the line fault of the metal wire using the resistance readings from the multimeter as described above. Accordingly, the preset threshold may be determined based on the resistance of the metal wire. The preset threshold may be adapted to be able to distinguish between the resistance values of the loop formed by the multimeter, the metal wire and the common electrode wire in a closed circuit and an open circuit state. As compared with the scheme using the electric current readings, the resistance measurement scheme does not require an external power supply or additional wires, which simplifies the detection process.

The above-mentioned method may be referred to as the "bisection method", since the detection of the line fault is performed with the metal wire fused off at the midpoint. Further, after a preliminary determination of the location of the short circuit of the metal wire using the above-mentioned method, a more accurate location of the short circuit of the metal wire can be determined by applying iteratively the "bisection method" as follows:

if the location of the short circuit is determined as being at the line section between the point-for-fusing and the back end point of the metal wire, move to step 1;

if the location of the short circuit is determined as being at the line section between the point-for-fusing and the front end point of the metal wire, move to step 2;

step 1: defining the line section where the short circuit of the metal wire is determined to be located as the current short circuit line, welding up the point-for-fusing, and moving to step 3;

step 2: defining the line section where the short circuit of the metal wire is determined to be located as the current short circuit line, and moving to step 3;

step 3: performing the fusing-off processing on the current short circuit line according to the above-mentioned preset rule;

step 4: upon the fusing-off of the current short circuit line, if the variation in the readings from the test instrument reaches the preset threshold, move to step 5; otherwise move to step 6;

step 5: determining the location of the short circuit of the metal wire as being at the line section in back of the point-for-fusing in the current short circuit line, and judging whether the determination of the location of the short circuit has reached a preset accuracy, and if so, end the iterative process; otherwise return to step 1;

step 6: determining the location of the short circuit of the metal wire as being at the line section in front of the point-for-fusing in the current short circuit line, and judging whether the determination of the location of the short circuit has reached a preset accuracy, and if so, end the iterative process; otherwise return to step 2.

As used herein, the phrases "in front of" and "in back of" are to be construed as being closer to the "front end point" with respect to the "back end point" along the metal wire and being closer to the "back end point" with respect to the "front end point" along the metal wire, respectively. Furthermore, according to an embodiment, judging whether the determination of the location of the short circuit has reached a preset accuracy during the iterative process can for example be based on the number of iterations it has taken at a given time.

Thus, after the ending of the iterative process, the short circuit of the metal wire may be localized with a preset accuracy. However, the localization accuracy may be further increased, even to a pixel cell level, by applying the following scheme:

defining the line section where the short circuit of the metal wire is determined to be located as the current short circuit line;

if the current short circuit line is located in front of the point-for-fusing corresponding to the last fusing-off processing, performing the fusing-off processing step by step on the current short circuit line at a step of one pixel cell starting from the point-for-fusing corresponding to the last fusing-off processing, and locating the short circuit of the metal wire as being between the current point-for-fusing and the point-for-fusing corresponding to the last fusing-off processing in the event that the variation in the readings from the test instrument reaches the preset threshold;

if the current short circuit line is located in back of the point-for-fusing corresponding to the last fusing-off processing, welding up the point-for-fusing corresponding to the last fusing-off processing and performing the fusing-off processing step by step on the current short circuit line at a step of one pixel cell starting from the point-for-fusing corresponding to the last fusing-off processing, and locating the short circuit of the metal wire as being between the current point-for-fusing and the point-for-fusing corresponding to the last fusing-off processing in the event that the variation in the readings from the test instrument reaches the preset threshold.

In an implementation, both the fusing-off and the welding-up processing may be implemented using a laser irradiation, which is known in the art and will not be discussed here in detail.

Taking a short circuit of a gate line as an example, the above-mentioned schemes is described below in detail in connection with three specific instances. It is to be noted that determination of the location of a short circuit of a source line (data line) is performed in the same manner as the gate line and will not be discussed here in detail.

Assuming that a Gate line-Common electrode Short circuit (GCS) occurs at the m-throw of gate line (hereinafter indicated as "gate line m") in a display panel prepared by a preparation process, then determination of the location of the short circuit may be achieved as follows.

Instance 1: Determination of a Preliminary Location of the Short Circuit of the Gate Line m As shown in FIG. 2(*a*), a front end point A and a back end point B of the gate line m are given in the panel to be detected, which correspond to the starting point and the terminal point in the m-th row of pixel cells, respectively.

Firstly, connecting the front end point A of the gate line m to a probe of a multimeter with a wire, and connecting the other probe of the multimeter to a common electrode wire. Since there exists an unnecessary connection (i.e. a short circuit) between the gate line m and the common electrode wire, the multimeter, the gate line m and the common electrode wire will form a loop if the gate line m and the common electrode wire are respectively connected to a respective probe of the multimeter. As stated above, the rotary switch of the multimeter may be configured such that a resistance measurement function is selected. At this point, the readings from the multimeter should be very small, for example a few hundreds of ohms.

Secondly, performing a fusing-off processing on the gate line m according to a preset rule. In accordance with the above embodiments of the present disclosure, a midpoint of the gate line m may be selected as the point-for-fusing x1 at which the fusing-off processing is performed, as shown in FIG. 2(*b*). More generally, an arbitrary point on the gate line m may be selected as the point-for-fusing at which the fusing-off processing is performed.

Next, observing whether the readings (of resistance values) from the multimeter vary upon the fusing-off of the gate line m.

One case is that if the readings from the multimeter vary and the variation in the readings reaches a preset threshold (which may be determined based on the resistance value of the metal wire, and which is generally high, for example tens of thousands of ohms), it indicates that the multimeter, the line section between the point-for-fusing x1 and the front end point A, and the common electrode wire do not form a loop, i.e., the short circuit is not located at the line section between the point-for-fusing x1 and the front end point A. Therefore, the location of the short circuit of the gate line m can be determined as being at the line section between the point-for-fusing x1 and the back end point B.

Another case is that if the readings from the multimeter do not vary, it indicates that the multimeter, the line section between the point-for-fusing x1 and the front end point A, and the common electrode wire form a loop, i.e., the short circuit is located at the line section between the point-for-fusing x1 and the front end point A. Therefore, the location of the short circuit of the gate line m can be determined as being at the line section between the point-for-fusing x1 and the front end point A.

In either case, the line section at which the short circuit of the gate line m is located can be determined preliminarily.

Figure 3:
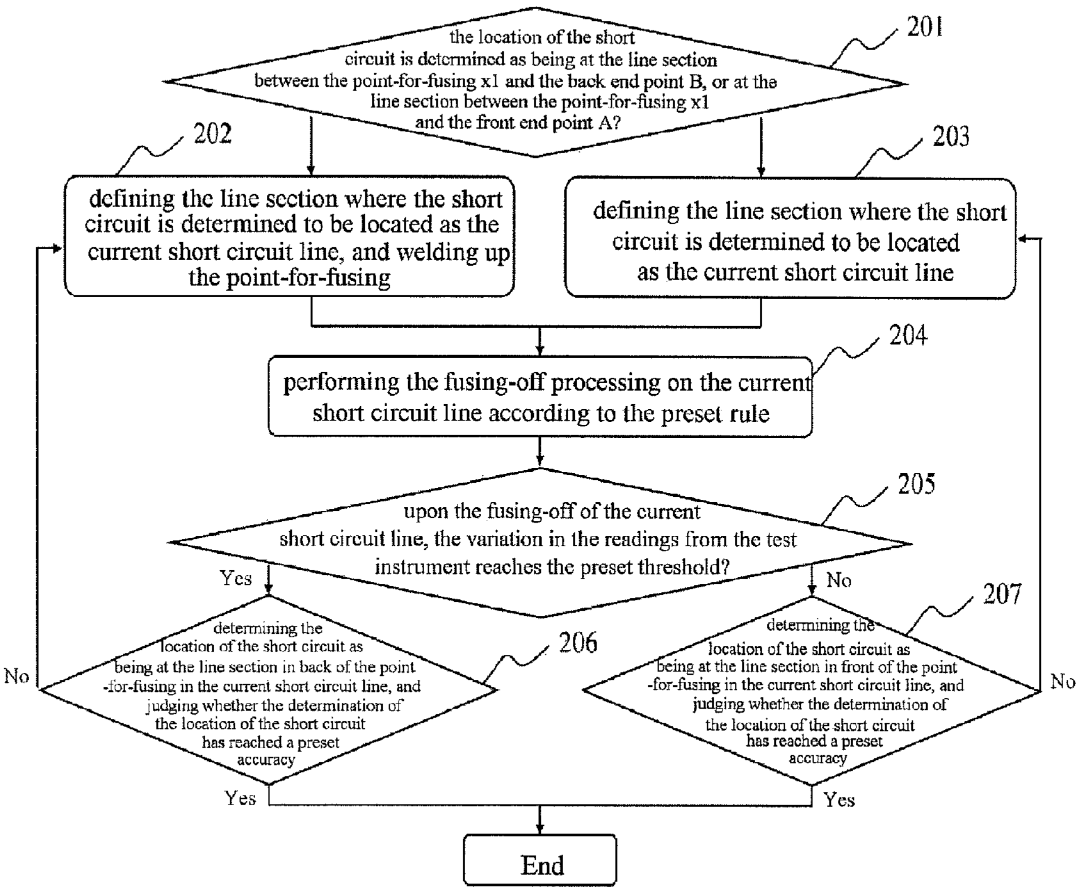
FIG. 3 is a schematic flow chart of a method of locating a short circuit of a gate line with a preset accuracy in instance 2 according to an embodiment of the present disclosure.

Instance 2: Localization of the Short Circuit of the Gate Line m with a Preset Accuracy As shown in FIG. 3, the method of locating the short circuit of the gate line m with a preset accuracy may comprise the following iterative process.

Step 201: after determination of an approximate location of the short circuit of the gate line m according to the scheme of the above instance 1, if the location of the short circuit is determined as being at the line section between the point-for-fusing x1 and the back end point B of the gate line m, move to step 202; if the location of the short circuit is determined as being at the line section between the point-for-fusing x1 and the front end point A of the gate line m, move to step 203.

Step 202: defining the line section where the short circuit of the gate line m is determined to be located as the current short circuit line, welding up the point-for-fusing, and moving to step 204.

Step 203: defining the line section where the short circuit of the gate line m is determined to be located as the current short circuit line, and moving to step 204.

Step 204: performing the fusing-off processing on the current short circuit line according to the preset rule.

Step 205: upon the fusing-off of the current short circuit line, if the variation in the readings from the test instrument reaches the preset threshold, move to step 206; otherwise move to step 207.

Step 206: determining the location of the short circuit of the gate line m as being at the line section in back of the point-for-fusing in the current short circuit line, and judging whether the determination of the location of the short circuit has reached a preset accuracy, and if so, end the iterative process; otherwise return to step 202.

Step 207: determining the location of the short circuit of the gate line m as being at the line section in front of the point-for-fusing in the current short circuit line, and judging whether the determination of the location of the short circuit has reached a preset accuracy, and if so, end the iterative process; otherwise return to step 203.

Specifically, the above-mentioned iterative process may be illustrated below with reference to FIGS. 2(*c*) to 2(*j*). In this iterative process, the location of the short circuit of the gate line m is detected by applying iteratively the "bisection method".

After application of the scheme as described in instance 1, if the location of the short circuit of the gate line m is determined as being at the line section between the point-for-fusing x1 and the back end point B, the line section between the point-for-fusing x1 and the back end point B is defined as short circuit line 1, and the point-for-fusing x1 is welded up, as shown in FIG. 2(*c*). Thereafter, the midpoint of the short circuit line 1 is selected as the point-for-fusing x2, and the point-for-fusing x2 is fused off, as shown in FIG. 2(*d*). After the fusing-off of the short circuit line 1, if the variation in the readings from the multimeter reaches the preset threshold, the location of the short circuit of the gate line m is determined as being at the line section between the point-for-fusing x2 and the back end point B; otherwise, the location of the short circuit of the gate line m is determined as being at the line section between the point-for-fusing x2 and the last point-for-fusing x1. If the location of the short circuit of the gate line m is determined as being at the line section between the point-for-fusing x2 and the last point-for-fusing x1, the line section between the point-for-fusing x2 and the last point-for-fusing x1 is defined as short circuit line 2, as shown in FIG. 2(*e*). Thereafter, the midpoint of the short circuit line 2 is selected as the point-for-fusing x3, and the point-for-fusing x3 is fused off, as shown in FIG. 2(*f*). After the fusing-off of the short circuit line 2, if the variation in the readings from the multimeter reaches the preset threshold, the location of the short circuit of the gate line m is determined as being at the line section between the point-for-fusing x3 and the adjacent back point-for-fusing x2; otherwise, the location of the short circuit of the gate line m is determined as being at the line section between the point-for-fusing x3 and the adjacent front point-for-fusing x1.

Likewise, if the location of the short circuit of the gate line m is determined as being at the line section between the point-for-fusing x1 and the front end point A, the line section between the point-for-fusing x1 and the front end point A is defined as short circuit line 1', as shown in FIG. 2(*g*). Thereafter, the midpoint of the short circuit line 1' is selected as the point-for-fusing x2', and the point-for-fusing x2' is fused off, as shown in FIG. 2(*h*). After the fusing-off of the short circuit line 1', if the variation in the readings from the multimeter reaches the preset threshold, the location of the short circuit of the gate line m is determined as being at the line section between the point-for-fusing x2' and the adjacent back point-for-fusing x1; otherwise, the location of the short circuit of the gate line m is determined as being at the line section between the point-for-fusing x2' and the front end point A. If the location of the short circuit of the gate line m is determined as being at the line section between the point-for-fusing x2' and the front end point A, the line section between the point-for-fusing x2' and the front end point A is defined as short circuit line 2', as shown in FIG. 2(*i*). Thereafter, the midpoint of the short circuit line 2' is selected as the point-for-fusing x3', and the point-for-fusing x3' is fused off, as shown in FIG. 2(*j*). After the fusing-off of the short circuit line 2', if the variation in the readings from the multimeter reaches the preset threshold, the location of the short circuit of the gate line m is determined as being at the line section between the point-for-fusing x3' and the adjacent back point-for-fusing x2'; otherwise, the location of the short circuit of the gate line m is determined as being at the line section between the point-for-fusing x3' and the front end point A.

The detection of the location of the short circuit of the gate line m is performed iteratively according to the above "bisection method" until the detection reaches a preset accuracy. For example, the short circuit of the gate line m may be localized in a range of 10 pixel cells.

Instance 3: localization of the short circuit of the gate line m at a pixel cell level Assuming that the short circuit of the gate line m is pinpointed as being at the line section between the point-for-fusing x3 and the adjacent back point-for-fusing x2, as shown in FIG. 2(*f*), and that this line section is of a length of 10 pixel cells, then the localization of the short circuit may be performed by continuing with the "bisection method" described above, or by applying the following scheme.

Figure 4:
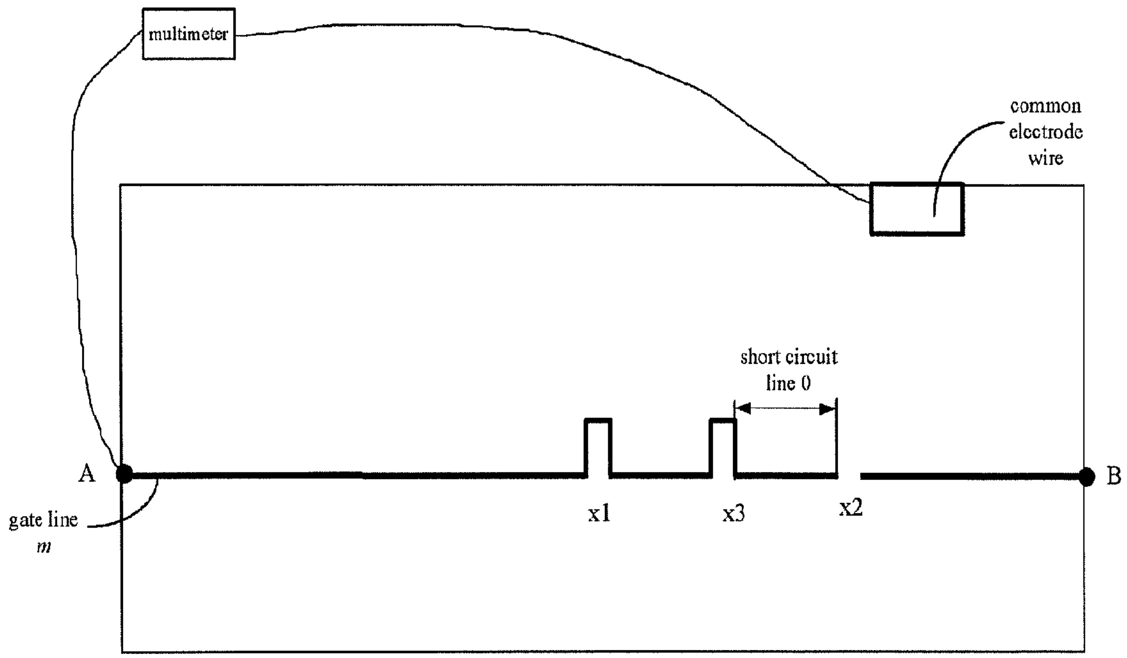
FIG. 4 is a schematic diagram of the operation for locating a short circuit of a gate line at a pixel cell level in instance 3 according to an embodiment of the present disclosure.

As shown in FIG. 4, the line section between the point-for-fusing x3 and the adjacent back point-for-fusing x2 is defined as the current short circuit line 0, and the point-for-fusing x3 is welded up. Then, the fusing-off processing is performed step by step on the current short circuit line 0 at a step of one pixel cell starting from the point-for-fusing x3, and the short circuit of the gate line m is localized as being between the current point-for-fusing and the point-for-fusing corresponding to the last fusing-off processing in the event that the variation in the readings from the test instrument reaches the preset threshold. In this way, localization of the short circuit of the gate line m may be achieved at a pixel cell level.

Figure 5:
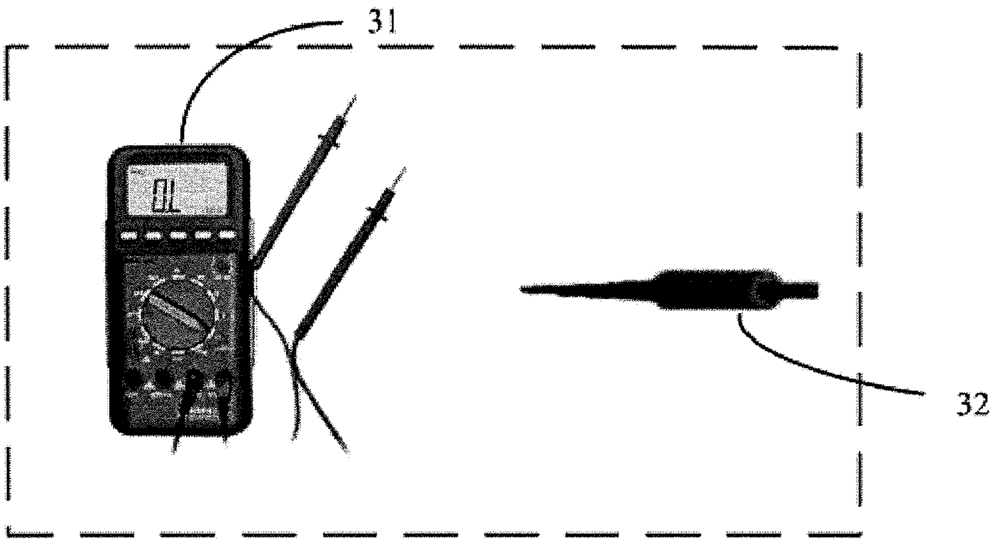
FIG. 5 is a structural schematic diagram of a system of determining a location of a line fault of a panel according to an embodiment of the present disclosure.

Furthermore, as shown in FIG. 5, according to another embodiment of the present disclosure, there is also provided a system of determining a location of a line fault of a display panel, which comprises a test instrument 31 and a laser 32.

The test instrument 31 may be used for detection of the condition of the connection between a metal wire that has suffered a line fault and a common electrode of the display panel. One probe of the test instrument 31 is connected to the front end point of the metal wire that has suffered the line fault, and the other probe of the test instrument is connected to the common electrode wire.

The laser 32 is used for performing the fusing-off processing at the selected point-for-fusing, and further for performing a welding-up processing on the point-for-fusing when the location of the short circuit is determined as being at the line section between the point-for-fusing and the back end point of the metal wire, so as to enable the detection of the line section between the point-for-fusing and the back end point by the test instrument.

According to the above embodiments of the present disclosure, a preliminary localization of a short circuit of a metal wire between the films of a display panel may be achieved, and the localization accuracy can be further improved by applying iteratively a "bisection method". Additionally or alternatively, the localization accuracy can be even increased to a pixel cell level by introducing an localization operation performed at a step of one pixel cell. In this way, the location of the line fault can be determined accurately, so as to facilitate the debugging of the manufacturing process of the display panel or the manufacturing machine thereof, to avoid occurrence of the same line fault later on.

While several specific implementation details are contained in the above discussions, these should not be construed as limitations on the scope of any disclosure or of what may be claimed, but rather as descriptions of features that may be specific to particular embodiments of particular disclosures. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations are to be performed in the particular order shown or in a sequential order, or that all illustrated operations are to be performed to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Various modifications, adaptations to the foregoing exemplary embodiments of this disclosure may become apparent to those skilled in the relevant arts in view of the foregoing description, when read in conjunction with the accompanying drawings. Any and all modifications will still fall within the scope of the non-limiting and exemplary embodiments of this disclosure. Furthermore, other embodiments of the disclosures set forth herein will come to mind to one skilled in the art to which these embodiments of the disclosure pertain having the benefit of the teachings presented in the foregoing descriptions and the associated drawings.

Therefore, it is to be understood that the embodiments of the disclosure are not to be limited to the specific embodiments disclosed and that modifications and other embodiments are intended to be included within the scope of the appended claims. Although specific terms are used herein, they are used in a generic and descriptive sense only and not for purposes of limitation.

The invention claimed is:

1. A method of determining a location of a line fault of a panel, comprising:

connecting a first probe of a test instrument to a first end of a metal wire having a line fault;

connecting a second probe of the test instrument to a common electrode wire;

breaking the metal wire; and determining a faulty section of the metal wire that contains the line fault based on a variation in readings from the test instrument before and after the metal wire is broken;

wherein breaking the metal wire comprises selecting a midpoint of the metal wire as a test point and breaking the metal wire at the test point.

2. The method of claim 1, wherein the line fault in the metal wire is a short circuit, and wherein the step of determining a faulty section of the metal wire comprises:

defining a test section of the metal wire between the first end of the wire and the test point when the reading from the test instrument does not exceed a predetermined threshold;

defining a test section of the metal wire between the test point and the second end of the wire when the reading from the test instrument exceeds a predetermined threshold;

wherein the predetermined threshold is determined based on the resistance of the metal wire.

3. The method of claim 2, further comprising the steps of:

step 1: selecting a test point within the test section according to a predetermined rule;

step 2: welding all breaks in the metal wire between the first end and the test point;

step 3: breaking the metal wire at the test point;

step 4: repeating the step of defining a test section;

step 5: measuring the test section;

step 6: identifying the test section as the faulty section if the test section is below a predetermined accuracy threshold; and step 7: repeating steps 1-6 if the test section is not below a predetermined accuracy threshold.

4. The method of claim 3, comprising:

step 1: defining a current test point one pixel after a start of the faulty section and a previous test point as the start of the faulty section;

step 2: welding all breaks in the metal wire between the first end and the current test point;

step 3: breaking the metal wire at the current test point;

step 4: identifying a faulty pixel as the pixel between the current and previous test points if the reading from the test instrument exceeds a predetermined threshold;

step 5: defining the previous test point as the current test point and the current test point as one pixel after the previous test point if the reading from the test instrument does not exceed a predetermined threshold;

step 6: repeating steps 2-5 if the faulty pixel is not identified.

5. The method of claim 1, wherein the metal wire is selected from the group consisting of a gate line and a data line.

6. The method of claim 1, wherein the test instrument is a multi-meter.

7. The method of claim 1, wherein laser irradiation is used for breaking the metal wire.

8. The method of claim 3, wherein laser irradiation is used for welding breaks in the metal wire.

9. A system for determining a location of a line fault of a panel comprising:

a test instrument comprising:

a first probe for connection to a first end of a metal wire having a line fault;

a second probe for connection to a common electrode wire; and a laser for breaking the metal wire at a test point so that a faulty section of the metal wire that contains the line fault can be located based on a variation in readings from the test instrument before and after the metal wire is broken, wherein a midpoint of the metal wire is selected as the test point.

10. The system of claim 9, wherein the metal wire is selected from the group consisting of a gate line and a data line.

11. The system of claim 9, wherein the test instrument is a multi-meter.

12. The system of claim 9, wherein the laser is further used for welding a break in the metal wire when the faulty section of the metal wire is located between the test point and the second end of the metal wire.

13. The method of claim 2, wherein the predetermined threshold is selected from the group consisting of a resistance threshold and an electric current threshold.

* * * * *